United States Patent
Yao et al.

(10) Patent No.: US 9,368,230 B2
(45) Date of Patent: Jun. 14, 2016

(54) SHIFT REGISTER UNIT, GATE DRIVING CIRCUIT, DRIVING METHOD AND DISPLAY APPARATUS

(71) Applicant: BOE TECHNOLOGY GROUP CO., LTD., Beijing (CN)

(72) Inventors: Xing Yao, Beijing (CN); Han-Seung-Woo, Beijing (CN); Yuanbo Zhang, Beijing (CN)

(73) Assignee: BOE Technology Gropu Co., Ltd., Beijing (CN)

( * ) Notice: Subject to any disclaimer, the term of this patent is extended or adjusted under 35 U.S.C. 154(b) by 0 days.

(21) Appl. No.: 14/517,001

(22) Filed: Oct. 17, 2014

(65) Prior Publication Data

US 2015/0348596 A1 Dec. 3, 2015

(30) Foreign Application Priority Data

May 30, 2014 (CN) .......................... 2014 1 0240523

(51) Int. Cl.
*G11C 19/18* (2006.01)
*G09G 3/36* (2006.01)
*G11C 19/28* (2006.01)

(52) U.S. Cl.
CPC ............ *G11C 19/184* (2013.01); *G09G 3/3674* (2013.01); *G11C 19/28* (2013.01); *G09G 2310/0286* (2013.01); *G11C 19/188* (2013.01)

(58) Field of Classification Search
CPC .................. G11C 19/18–19/184; G11C 19/28; G09G 3/3674; G09G 2310/0286
See application file for complete search history.

(56) References Cited

U.S. PATENT DOCUMENTS

| 8,842,061 B2 * | 9/2014 | Chen ...................... G11C 19/28 345/100 |
| 8,964,932 B2 * | 2/2015 | Wu ....................... G09G 3/3266 377/64 |
| 2014/0160000 A1 * | 6/2014 | Ma ....................... G09G 3/3677 345/100 |

* cited by examiner

*Primary Examiner* — Patrick O'Neill
(74) *Attorney, Agent, or Firm* — Westman, Champlin & Koehler, P.A.

(57) ABSTRACT

Embodiments of the present disclosure provide a shift register unit, a gate driving circuit, a driving method and a display apparatus, which can simplify the design of connection lines among the shift register units and thereby is beneficial to achieve a narrow frame of the product. The shift register unit comprises an input module connected to an input terminal, a first control signal terminal and a first node; an output module connected to a first node, a second node, a second control signal terminal, an output terminal and a second level terminal; and an output control module connected to the first node, the second node, the output terminal, a first level terminal and the second level terminal. The embodiments of the present disclosure are used to manufacture displays.

20 Claims, 6 Drawing Sheets

SHIFT REGISTER UNIT, GATE DRIVING CIRCUIT, DRIVING METHOD AND DISPLAY APPARATUS

CROSS-REFERENCE TO RELATED APPLICATION(S)

This application claims priority to the Chinese Application No. 201410240523.3 filed on May 30, 2014, which is incorporated herein by reference in its entirety.

TECHNICAL FIELD

The disclosure relates to the manufacturing field of displays, and in particular, to shift register units, gate driving circuits, driving methods and display apparatuses.

BACKGROUND

In recent years, displays are developed towards a trend of a high integration level and a low cost. A very important technology is implementation of mass production using a Gate Driver on Array (GOA) technology. A gate switching circuit is integrated onto an array substrate of a display panel using the GOA technology, thereby omitting an integrated circuit part of a gate driver and thus reducing a product cost in terms of both a material cost and manufacturing processes. The gate switching circuit integrated on the array substrate using the GOA technology is also referred to as a gate driving circuit.

The gate driving circuit includes a plurality of shift register units, each shift register unit corresponding to a gate line. Specifically, each shift register unit has an input terminal connected to a gate line, and an output terminal connected to an input terminal of the next shift register unit. Each shift register unit, except for the first shift register unit, has an output terminal connected to a reset terminal of the previous shift register unit, to output a reset signal to the previous shift register unit through the reset terminal. Thereby, when a signal is output through a gate line, a level of an output signal of the previous gate line is pulled down. Such structure needs a design of reset signal lines among shift register units, and therefore connection lines among the shift register units are complex and are disadvantage to achieve a narrow frame of a product.

SUMMARY

Embodiments of the present disclosure provide a shift register unit, a gate driving circuit, a driving method and a display apparatus, which can simplify the design of connection lines among shift register units and thereby be beneficial to achieve a narrow frame of a product.

The embodiments of the present disclosure provide a shift register unit, comprising:

an input module connected to an input terminal, a first control signal terminal and a first node, to output an input signal of the input terminal to the first node under the control of a first control signal of the first control signal terminal;

an output module connected to the first node, a second node, a second control signal terminal, an output terminal and a second level terminal, to output a second control signal of the second control signal terminal or a second level signal of the second level terminal to the output terminal under the control of the first node and the second node; and an output control module connected to the first node, the second node, the output terminal, a first level terminal and the second level terminal, to control levels of the first node and the second node under the control of a signal of the output terminal, the first level signal of the first level terminal and the second level signal of the second level terminal.

Further, the input module comprises:

a first transistor having a first electrode connected to the input terminal, a second electrode connected to the first node, and a gate electrode connected to the first control signal terminal.

Further, the input module comprises two transistors in series. The two transistors each have gate electrodes connected to the first control signal terminal. A first transistor of the two transistors has a first electrode connected to the input terminal, a second transistor of the two transistors has a first electrode connected to a second electrode of the first transistor, and the second transistor has a second electrode connected to the first node.

Further, the output module comprises a pull-up module and a pull-down module, wherein the pull-up module is connected to the second control signal terminal, the first node and the output terminal, to output the second control signal of the second control signal terminal to the output terminal under the control of the first node; and the pull-down module is connected to the output terminal, the second node and the second level terminal, to output the second level signal of the second level terminal to the output terminal under the control of the second node.

Further, the pull-up module comprises:

a second transistor having a first electrode connected to the second control signal terminal, a gate electrode connected to the first node, and a second electrode connected to the output terminal.

Further, the pull-down module comprises:

a sixth transistor having a first electrode connected to the output terminal, a gate electrode connected to the second node, and a second electrode connected to the second level terminal.

Further, the output control module comprises:

a capacitor having one terminal connected to the first node and the other terminal connected to the output terminal;

a third transistor having a first electrode connected to the first node, a second electrode connected to the second level terminal, and a gate electrode connected to the second node;

a fourth transistor having a first electrode and a gate electrode both connected to the first level terminal, and a second electrode connected to the second node;

a fifth transistor having a first electrode connected to the second node, a gate electrode connected to the first node, and a second electrode connected to the second level terminal.

Further, the output control module comprises:

a capacitor having one terminal connected to the first node and the other terminal connected to the output node; and a third transistor and a seventh transistor, wherein the third transistor has a first electrode connected to the first node and a second electrode connected to a first electrode of the seventh transistor, the third transistor and the seventh transistor each have gate electrodes connected to the second node, and the seventh transistor has a second electrode connected to the second level terminal;

a fourth transistor having a first electrode and a gate electrode both connected to the first level terminal, and a second electrode connected to the second node; and a fifth transistor having a first electrode connected to the second node, a gate electrode connected to the first node, and a second electrode connected to the second level terminal.

Further, the first level signal is a high level signal and the second level signal is a low level signal.

Further, both the first control signal and the second control signal are clock control signals, and there is a predetermined phase difference between the second control signal and the first control signal.

The present disclosure further provides a gate driving circuit, comprising a plurality of cascaded shift register units as described above, wherein an input terminal of a first stage of shift register unit receives a start vertical pulse signal to start outputting output signals at various stages in sequence, wherein for any shift register unit, excluding the first stage of shift register unit and a last stage of shift register unit, an output terminal of the shift register unit is connected to a signal input terminal of a next stage of shift register unit;

the $n^{th}$ stage of shift register unit has a first control signal terminal connected to a first clock signal input terminal and a second control signal terminal connected to a second clock signal input terminal;

the $(n+1)^{th}$ stage of shift register unit has a first control signal terminal connected to the second clock signal input terminal and a second control signal terminal connected to a third clock signal input terminal;

the $(n+2)^{th}$ stage of shift register unit has a first control signal terminal connected to the third clock signal input terminal and a second control signal terminal connected to a fourth clock signal input terminal;

the $(n+3)^{th}$ stage of shift register unit has a first control signal terminal connected to the fourth clock signal input terminal and a second control signal terminal connected to the first clock signal input terminal, wherein $n=4m+1$ and m is an integer larger than or equal to 0, and first level terminals of all shift register units are connected together, and second level terminals of all shift register units are connected together.

The present disclosure further provides a method for driving the gate driving circuit as described above, comprising:

providing a first level signal at a first level terminal and providing a second level signal at a second level terminal;

providing a first clock signal, a second clock signal, a third clock signal and a fourth clock signal at a first clock signal input terminal, a second first clock signal input terminal, a third first clock signal input terminal, and a fourth first clock signal input terminal respectively, to cause output terminals of various stages of shift register unit to output in sequence, wherein there is a first predetermined phase difference between the second clock signal and the first clock signal, a second predetermined phase difference between the third clock signal and the second clock signal, a third predetermined phase difference between the fourth clock signal and the third clock signal, and a fourth predetermined phase difference between the first clock signal and the fourth clock signal.

Further, the first clock signal is an inversion signal of the third clock signal, and the second clock signal is an inversion signal of the fourth clock signal.

The present disclosure further provides a display apparatus, comprising the gate driving circuit as described above.

The shift register unit according to the embodiments of the present disclosure includes an input module, an output module and an input/output control module. Compared with the structure in the prior art, there is no need to design a separate reset module, and therefore there is also no need to design reset signal lines among the shift register units. This can simplify the design of connection lines among the shift register units and thereby be beneficial to achieve a narrow frame of the product.

BRIEF DESCRIPTION OF THE DRAWINGS

In order to illustrate technical solutions in embodiments of the present disclosure or in the prior art more clearly, drawings needed to be used in the description of the embodiments or the prior art will be described below in brief. Obviously, the drawings described below are merely some embodiments of the present disclosure. Those skilled persons in the art can further imagine other drawings according to the drawing without any creative efforts.

DETAILED DESCRIPTION OF THE EMBODIMENTS

The technical solutions in the embodiments of the present disclosure will be clearly and completely described below with reference to the drawings of the embodiments of the present disclosure. Obviously, the embodiments as described are merely a part of the embodiments of the present disclosure. All other embodiments obtained by those skilled in the art based on the embodiments of the present disclosure without any creative efforts should belong to the scope protected by the present disclosure.

All embodiments of the present disclosure are described by taking thin film transistors as an example. It should be noted that the present disclosure is not limited to the thin film transistors, and instead, field effect transistors or other devices with the same features etc. may also be used. As a source electrode and a drain electrode of a transistor used here are symmetric, there is no difference between the source electrode and the drain electrode of a transistor. In the embodiments of the present disclosure, in order to distinguish two electrodes of the transistor except for the gate electrode, one electrode is referred to as a first electrode, and the other electrode is referred to as a second electrode. In addition, the transistor used herein may be a P or N type transistor. A P type transistor is on when the gate electrode is at a low level, and an N type transistor is on when the gate electrode is at a high level. The embodiments of the present disclosure are described by taking a drain electrode as the first electrode, a source electrode as the second electrode and an N type transistor as an example. Of course, the present disclosure is not limited thereto.

Figure 1:
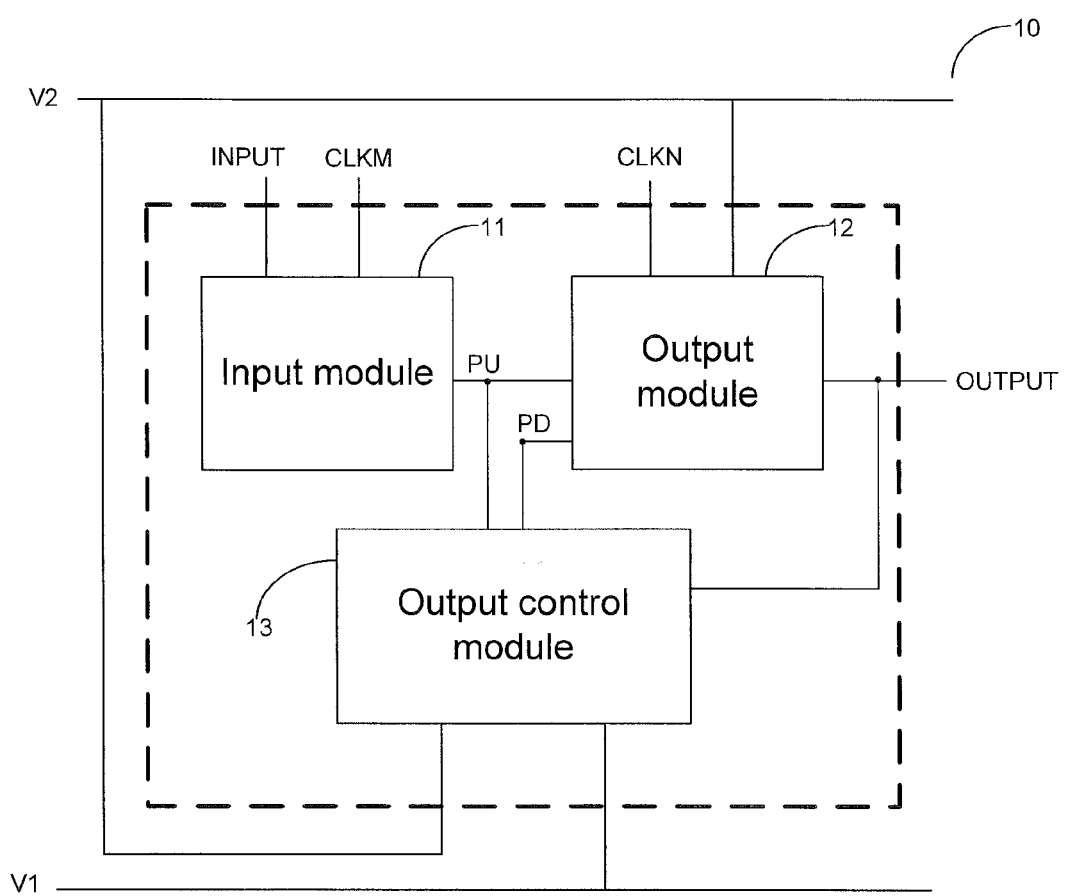
FIG. 1 is a structural schematic diagram of a shift register unit according to an embodiment of the present disclosure.

FIG. 1 is a structural schematic diagram of a shift register unit 10 according to an embodiment of the present disclosure. As shown in FIG. 1, the shift register unit 10 includes an input module 11, an output module 12 and an output control module 13.

The input module 11 is connected to an input terminal INPUT, a first control signal terminal CLKM and a first node PU, to output an input signal of the input terminal INPUT to the first node PU under the control of a first control signal of the first control signal terminal CLKM.

The output module 12 is connected to the first node PU, a second node PD, a second control signal terminal CLKN, an output terminal OUTPUT and a second level terminal V2, to output a second control signal of the second control signal terminal CLKN or a second level signal of the second level terminal V2 to the output terminal OUTPUT under the control of the first node PU and the second node PD.

The output control module 13 is connected to the first node PU, the second node PD, the output terminal OUTPUT, the first level terminal V1 and the second level terminal V2, to control levels of the first node PU and the second node PD under the control of a signal of the output terminal OUTPUT, a first level signal of the first level terminal V1 and the second level signal of the second level terminal V2.

In the shift register unit according to the embodiment of the present disclosure, the output control module controls the levels of the first node PU and the second node PD under the control of the signal of the output terminal, the first level signal of the first level terminal, and the second level signal of the second level terminal, while the first level signal of the first level terminal and the second level signal of the second level terminal cause the output terminal to output the second control signal of the second control signal terminal or the second level signal of the second level terminal. The first control signal, the second control signal and a relationship among the second control signal, the input signal and a reset level are suitably configured to cause the shift register unit to output the input signal of the input terminal at a suitable time and output the reset level at a suitable time, i.e., performing reset. In this way, the reset is performed without a reset signal from outside (for example, from the next shift register unit). In the shift register unit according to the embodiment of the present disclosure, the second control signal includes an input signal and a reset signal (a reset level), to cause the output terminal to output the input signal at a predetermined time and output the reset signal at a different time.

The shift register unit according to the embodiment of the present disclosure includes an input module, an output module and an output control module. Compared with the structure in the prior art, there is no need to design a reset module, and therefore there is also no need to design reset signal lines among the shift register units. This can simplify the design of connection lines among the shift register units, reduce areas of the shift register units, and thereby be beneficial to achieve a narrow frame of the product.

The output module of the shift register unit according to the embodiment of the present disclosure may comprise a pull-up module and a pull-down module. The pull-up module is connected to the second control signal terminal, the first node and the output terminal, to output the second control signal of the second control signal terminal to the output terminal under the control of the first node. The pull-down module is connected to the output terminal, the second node and the second level terminal, to output the second level signal of the second level terminal to the output terminal under the control of the second node.

Figure 2:
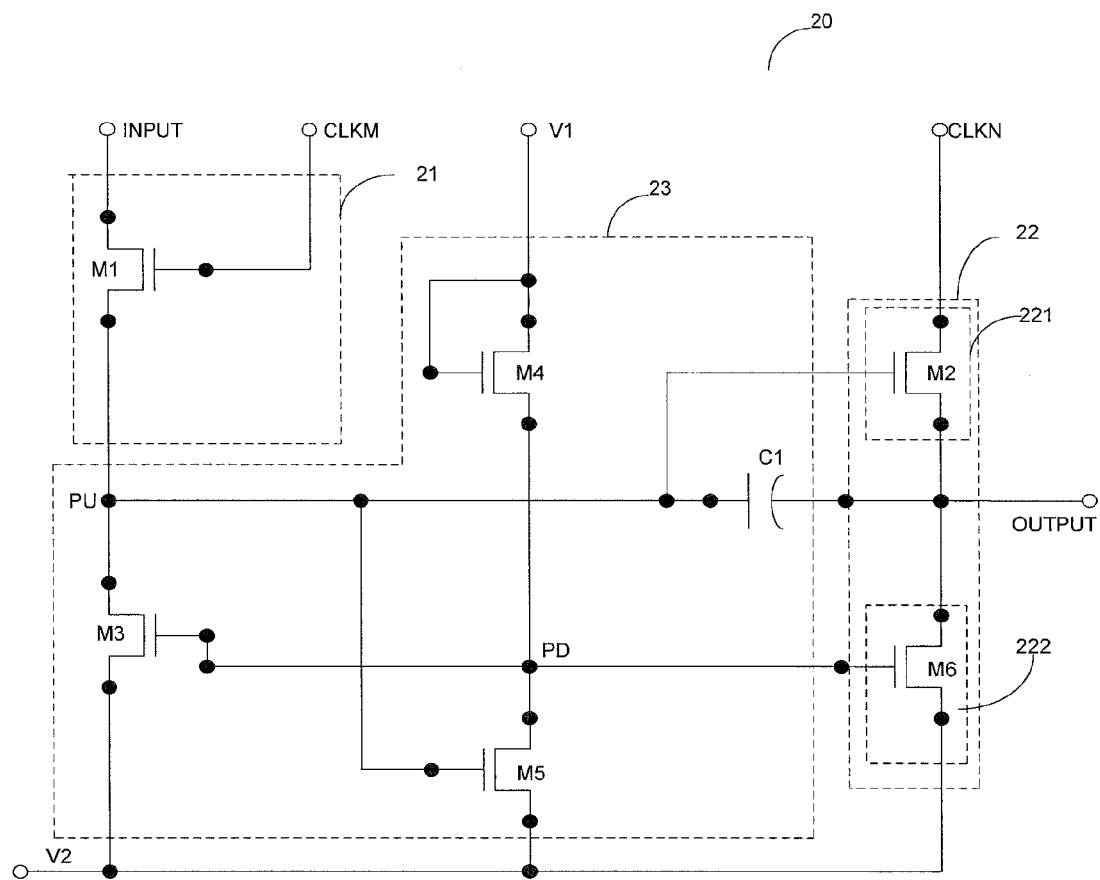
FIG. 2 is a structural schematic diagram of a shift register unit according to another embodiment of the present disclosure.

FIG. 2 illustrates a structural schematic diagram of a shift register unit 20 according to another embodiment of the present disclosure. As shown in FIG. 2, the shift register unit 20 includes an input module 21, an output module 22 and an output control module 23. The input module 21 includes a first transistor M1. The output module 22 includes a pull-up module 221 and a pull-down module 222. Further, the pull-up module 221 includes a second transistor M2, and the pull-down module 222 includes a sixth transistor M6. The output control module 23 includes a capacitor C1, a third transistor M3, a fourth transistor M4, and a fifth transistor M5. In addition, as shown by the shift register unit 20 in FIG. 2, an input terminal is denoted as INPUT, an output terminal is denoted as OUTPUT, a first control signal terminal is denoted as CLKM, a second control signal is denoted as CLKN, a first node is denoted as PU, a second node is denoted as PD, a first level terminal is denoted as V1, and a second level terminal is denoted as V2. When an N type transistor is used, the first level terminal V1 is at a high level VGH, and the second level terminal V2 is at a low level VGL.

With reference to the shift register unit 20 illustrated in FIG. 2, a connection relationship among various parts thereof will be described in detail below.

M1 of the input module 21 has a first electrode connected to the input terminal INPUT, a gate electrode connected to the first control signal terminal CLKM, and a second electrode connected to the first node PU.

M2 of the output module 22 has a gate electrode connected to the first node PU, a first electrode connected to the second control signal terminal CLKN, and a second electrode connected to the output terminal OUTPUT. M6 of the output module 22 has a first electrode connected to the output terminal OUTPUT, a gate electrode connected to the second node PD, and a second electrode connected to the second level terminal V2.

M3 of the output control module 23 has a first electrode connected to the first node PU, a gate electrode connected to the second node PD, and a second electrode connected to the second level terminal V2. The capacitor C1 of the output control module 23 has one terminal connected to the first node PU, and the other terminal connected to the output terminal OUTPUT. M4 of the output control module 23 has a first electrode and a gate electrode both connected to the first level terminal V1, and a second electrode connected to the second node PD. M5 of the output control module 23 has a first electrode connected to the second node PD, a gate electrode connected to the first node PU, and a second electrode connected to the second level terminal V2.

Figure 3:
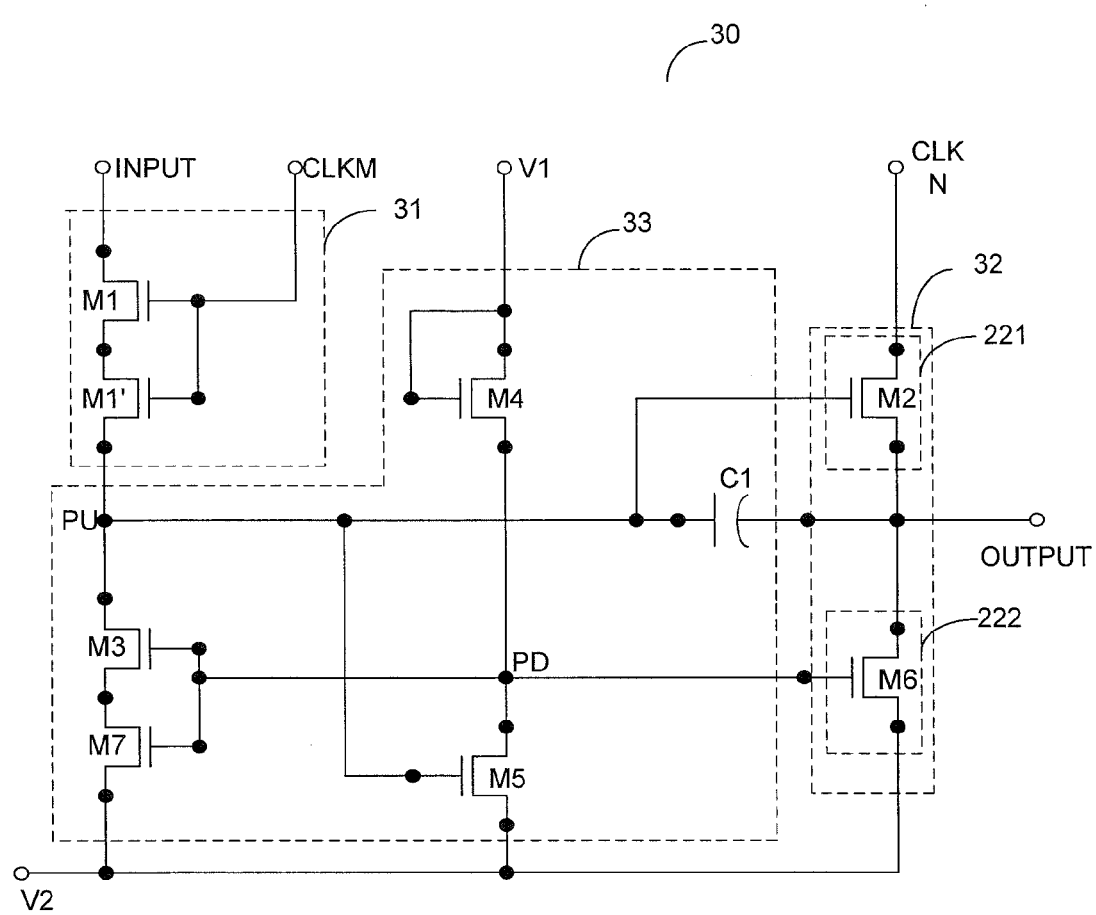
FIG. 3 is a structural schematic diagram of a shift register unit according to still another embodiment of the present disclosure.

FIG. 3 illustrates a structural schematic diagram of a shift register unit 30 according to still another embodiment of the present disclosure. As shown in FIG. 3, the shift register unit 30 includes an input module 31, an output module 32 and an output control module 33. As shown, the output module 32 of the shift register unit 30 has the same structure as the output module 22 illustrated in FIG. 2. The difference between the shift register unit 30 and the shift register unit 20 illustrated in FIG. 2 is that the input module 31 includes two transistors M1 and M1' in series; and the output control module 33 includes a capacitor C1, a third transistor M3, a fourth transistor M4, a fifth transistor M5 and a seventh transistor M7, wherein the two transistors M3 and M7 are connected in series. Specifically, the transistors M1 and M1' each have gate electrodes connected to the first control signal terminal CLKM. The first transistor M1 of the two transistors has a first electrode connected to the input terminal INPUT, the second transistor M1' of the two transistors has a first electrode connected to a second electrode of the first transistor M1, and the second transistor M1' has a second electrode connected to the first node PU. M3 and M7 are connected in series. Specifically, M3 has a first electrode connected to the first node PU, M3 and M7 each have gate electrodes connected to the second node PD, M3 has a second electrode connected to a first electrode of M7, and M7 has a second electrode connected to the second level terminal V2. Compared with the structure of one TFT, two TFTs in series have a smaller leakage current, thereby further improving stability of the circuit. A connection structure of the capacitor C1, the fourth transistor M4 and the fifth transistor M5 in the output control module 33 is the same as that of the capacitor C1, the fourth transistor M4 and the fifth transistor M5 in the output control module 23 illustrated in FIG. 2. The description thereof will be omitted here.

Further, in the circuits illustrated in FIGS. 2 and 3, the first level signal may be a high level signal, and the second level signal may be a low level signal. Both the first control signal and the second control signal are clock signals, and there is a predetermined phase difference between the second control signal and the first control signal.

Figure 4:
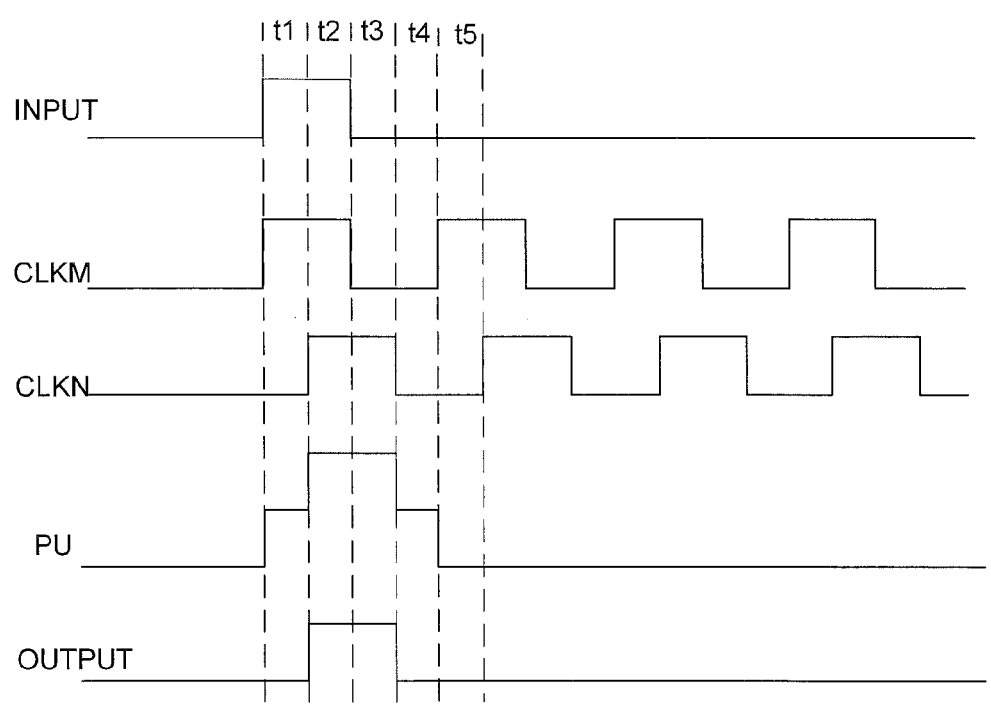
FIG. 4 is a schematic diagram of a driving sequence of the shift register unit illustrated in FIG. 2.

FIG. 4 illustrates a schematic diagram of a driving sequence of the shift register unit illustrated in FIG. 2. In an example, as shown in FIG. 4, both the first control signal and the second control signal have a duty cycle of 50% and have the same period T. In addition, a predetermined phase difference between the second control signal and the first control signal is ¼ of the period T.

With reference to the schematic diagram of the driving sequence illustrated FIG. 4, the operating principle of the shift register unit illustrated in FIG. 2 will be described by taking the first level terminal V1 being at a high level and the second level terminal V2 being at a low level as an example.

During a period of time t1, a clock signal input at the first control signal terminal CLKM is at a high level, a clock signal input at the second control signal terminal CLKN is at a low level, and the input terminal INPUT is at a high level. At this time, M1 is on, and the high level signal input at the first control signal terminal CLKM is output to the first node PU through M1. Therefore, the first node PU is at a high level. At this time, M2 and M5 are on, the second node PD is connected to the second level terminal through M5, and the second level signal of the second level terminal V2 is at a low level. Therefore, the second node PD is at a low level. Thus, M3 and M6 are off, and therefore the output terminal OUTPUT of the shift register unit outputs the low level signal of the terminal CLKN at this time.

During a period of time t2, the clock signal input at CLKN becomes a high level, the clock signal input at CLKM and the input terminal INPUT still remain at a high level. The first transistor M1 still remains on, and the first node PU is still at a high level. At this time, M2 and M5 are still on. As the clock signal input at CLKN becomes a high level signal, one terminal of the capacitor C1 connected to the output terminal becomes a high level. Due to the coupling effect of the capacitor C1, the level of the first node PU connected to the other terminal of C1 rises. At this time, the second node PD still remains at a low level, and M3 and M6 are off. Thereby, the output terminal of the shift register unit outputs a high level signal of the terminal CLKN.

During a period of time t3, the clock signal input at CLKN remains at a high level, the clock signal input at CLKM becomes a low level. The input signal of the input terminal INPUT of the shift register unit becomes a low level. At this time, M1 is off. Due to the existence of the capacitor C1, the first node PU maintains at its level of the period of time T2. At this time, M2 and M5 still maintain on, the second node PD is at a low level, and M3 and M6 still maintain off. Therefore, the output terminal of the shift register unit outputs a high level signal of the terminal CLKN.

During a period of time t4, the clock signal input at CLKN becomes a low level, the clock signal input at CLKM still remains at a low level, and the input signal of the input terminal INPUT of the shift register unit is at a low level. At this time, M1 remains in an off state, the first node PU is at a high level, M2 and M5 remain in an on state, and a low level signal of the terminal CLKN is provided to the output terminal OUTPUT through M2. As one terminal of the capacitor C1 is connected to the OUTPUT terminal and the other terminal of the capacitor C1 is connected to the first node PU, the level at the node PU gradually drops under the coupling effect of the capacitor C1. In addition, PD is at a low level, and M3 and M6 remain off. Therefore, the output terminal of the shift register unit outputs a low level signal of the terminal CLKN at this time.

During a period of time t5, the clock signal input at CLKN remains at a low level, the clock signal input at CLKM becomes a high level, and the input signal of the input terminal INPUT of the shift register unit is at a low level. At this time, M1 is on. Therefore, the node PU becomes a low level. Thereby, M2 and M5 become in an off state, and M4 is on. As the signal input at the terminal V1 is a high level signal, the second node PD becomes a high level and M3 and M6 are on. At this time, both terminals of the capacitor C1 are pulled down simultaneously, and the output terminal OUTPUT of the shift register terminal outputs the second level signal of the second level terminal, i.e., a low level signal, thereby implementing reset of the shift register unit.

It should be noted that the operating principle of the circuit in FIG. 3 is similar to that of FIG. 2. The transistors M1 and M1' in series in FIG. 3 are off or on at the same time, and M3 and M7 are also off or on at the same time. Such a cascaded structure can reduce a leakage current of the transistors. The operating principle of other transistors is the same as that of FIG. 2. The description thereof will be omitted here.

The shift register unit according to the embodiments of the present disclosure can implement reset of two stages. The reset of a first stage is reset of the output terminal OUTPUT. During the period of time t4 illustrated in FIG. 4, both the clock signal input at the terminal CLKM and the clock signal input at the terminal CLKN are at low levels. A charging and discharging ratio relationship between M3 and M5 enables the first node PU to still maintain at a high level and enables the second node PD to still maintain at a low level. In this way, M2 may still maintain in an on state, i.e., M2 can be used to implement reset of the output terminal OUTPUT. At this time, the output terminal OUTPUT outputs a signal of CLKN, i.e., a low level signal. The reset of a second stage is reset of the first node PU. This can avoid abnormal output of the circuit due to incomplete reset. During the period of time t5 illustrated in FIG. 4, the clock signal input at the terminal CLKM is at a high level. At this time, M1 is on, and thereby the first node PU may maintain in a low level state all the time, and the whole shift register unit is reset at this time.

The level of the output terminal of the shift register unit is pulled down by the terminal CLKN in the period of time t4 and the level of an intermediate node of the shift register unit may be pulled down by the input module in the period of time t5 without a separate reset circuit unit. Therefore, compared with the conventional structure, there is no need to design a reset module for the above shift register unit, and therefore there is also no need to design reset circuits among the shift register units. This can simplify the design of connection lines among the shift register units, reduce areas of the shift register units, and thereby be beneficial to achieve a narrow frame of the product.

Figure 5:
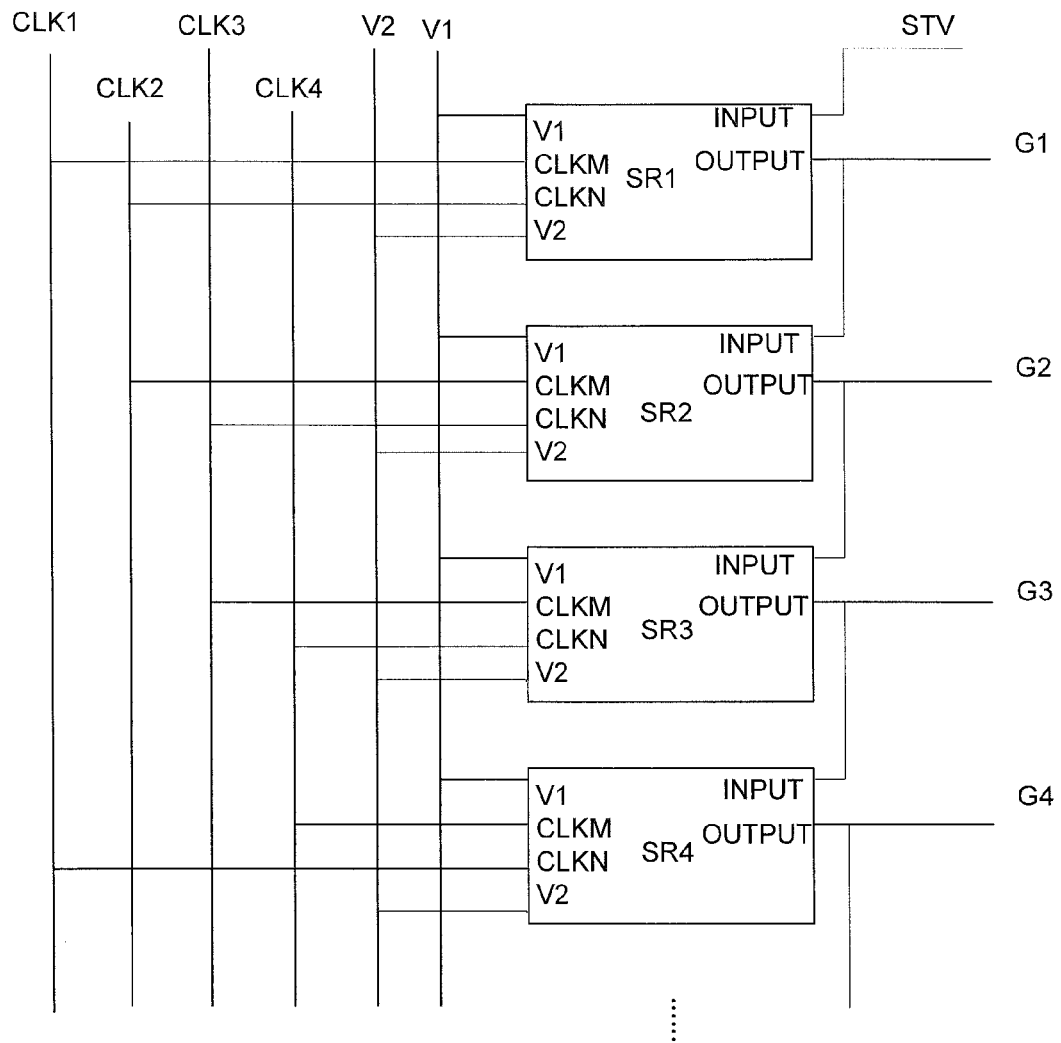
FIG. 5 is a structural schematic diagram of a gate driving circuit according to an embodiment of the present disclosure.

FIG. 5 illustrates a structural schematic diagram of a gate driving circuit according to an embodiment of the present disclosure. As shown in FIG. 5, the gate driving circuit includes a plurality of cascaded shift register units, wherein an input terminal of a first stage of shift register unit receives a start vertical pulse signal to start outputting at various stages in sequence, wherein for any shift register unit excluding the first stage of shift register unit and a last stage of shift register unit, an output terminal of the shift register unit is connected to an input terminal of a next stage of shift register unit;

the $n^{th}$ stage of shift register unit has a first control signal terminal connected to a first clock signal input terminal, and a second control signal terminal connected to a second clock signal input terminal;

the $(n+1)^{th}$ stage of shift register unit has a first control signal terminal connected to the second clock signal input terminal, and a second control signal terminal connected to a third clock signal input terminal;

the $(n+2)^{th}$ stage of shift register unit has a first control signal terminal connected to the third clock signal input terminal, and a second control signal terminal connected to a fourth clock signal input terminal;

the $(n+3)^{th}$ stage of shift register unit has a first control signal terminal connected to the fourth clock signal input terminal, and a second control signal terminal connected to the first clock signal input terminal, wherein n=4m+1 and m is an integer larger than or equal to 0.

In addition, an output terminal of each stage of shift register unit is connected to a gate line, to provide a switching signal to switches in pixel units connected to the gate line.

Specifically, the gate driving circuit illustrated in FIG. 5 includes a plurality of cascaded shift register units SR1, SR2, SR3, SR4 etc. An output terminal OUTPUT of the first stage of shift register unit SR1 is connected to an input terminal INPUT of the second stage of shift register unit SR2 and a gate line G1; an output terminal OUTPUT of the second stage of shift register unit SR2 is connected to an input terminal INPUT of the third stage of shift register unit SR3 and a gate line G2; an output terminal OUTPUT of the third stage of shift register unit SR3 is connected to an input terminal INPUT of the fourth stage of shift register unit SR4 and a gate line G3; and other stages of shift register unit are connected in this manner. In addition, each shift register unit has two control signal terminals, i.e., a first control signal terminal CLKM and a second control signal terminal CLKN, to receive a first control signal and a second control signal respectively. Alternatively, both the first control signal and the second control signal are clock control signals.

There are a first clock signal terminal CLK1, a second clock signal terminal CLK2, a third clock signal terminal CLK3 and a fourth clock signal terminal CLK4 in FIG. 5. The first to fourth clock signal terminals provide first to fourth clock signals respectively. The first stage of shift register unit SR1 has a first control signal terminal CLKM connected to the first clock signal input terminal CLK1 and a second control signal terminal CLKN connected to the second clock signal input terminal CLK2. The second stage of shift register unit SR2 has a first control signal terminal CLKM connected to the second clock signal input terminal CLK2 and a second control signal terminal CLKN connected to the third clock signal input terminal CLK3. The third stage of shift register unit SR3 has a first control signal terminal CLKM connected to the third clock signal input terminal CLK3 and a second control signal terminal CLKN connected to the fourth clock signal input terminal CLK4. The fourth stage of shift register unit SR4 has a first control signal terminal CLKM connected to the fourth clock signal input terminal CLK4 and a second control signal terminal CLKN connected to the first clock signal input terminal CLK1. Other stages of shift register unit are connected to the CLK1-CLK4 in the manner in sequence. In the present embodiment, a StarT Vertical pulse signal STV is input at the input terminal INPUT of the first stage of shift register unit SR1. A first level terminal V1 and a second level terminal V2 in each stage of shift to register unit in FIG. 5 are connected to a first level signal and a second level signal respectively.

In each shift register unit, the first level terminal V1 receives the first level signal, and the second level terminal V2 receives the second level signal. In other words, first level terminals of various shift register units are connected together, and second level terminals of various shift register units are connected together.

The present embodiment further provides a method for driving the above gate driving circuit, including:

providing a first level signal at a first level terminal and providing a second level signal at a second level terminal;

providing a first clock signal, a second clock signal, a third clock signal and a fourth clock signal at a first clock signal input terminal, a second clock signal input terminal, a third clock signal input terminal, and a fourth clock signal input terminal respectively, to cause output terminals of various stages of shift register unit to output in sequence.

wherein there is a first predetermined phase difference between the second clock signal and the first clock signal, a second predetermined phase difference between the third clock signal and the second clock signal, a third predetermined phase difference between the fourth clock signal and the third clock signal, and a fourth predetermined phase difference between the first clock signal and the fourth clock signal.

In FIG. 5, CLK1 is a first clock signal input terminal, CLK2 is a second clock signal input terminal, CLK3 is a third clock signal input terminal, and CLK4 is a fourth clock signal input terminal. Alternatively, a first clock signal of the first clock signal input terminal CLK1 is of a first predetermined phase difference in advance with respect to a second clock signal of the second clock signal input terminal CLK2; the second clock signal of the second clock signal input terminal CLK2 is of a second predetermined phase difference in advance with respect to a third clock signal of the third clock signal input terminal CLK3; the third clock signal of the third clock signal input terminal CLK3 is of a third predetermined phase difference in advance with respect to a third clock signal of the fourth clock signal input terminal CLK4; and the fourth clock signal of the fourth clock signal input terminal CLK4 is of a fourth predetermined phase difference in advance with respect to the first clock signal of the first clock signal input terminal CLK1. Further, the first clock signal is an inversion signal of the third clock signal, and the second clock signal is an inversion signal of the fourth clock signal.

Figure 6:
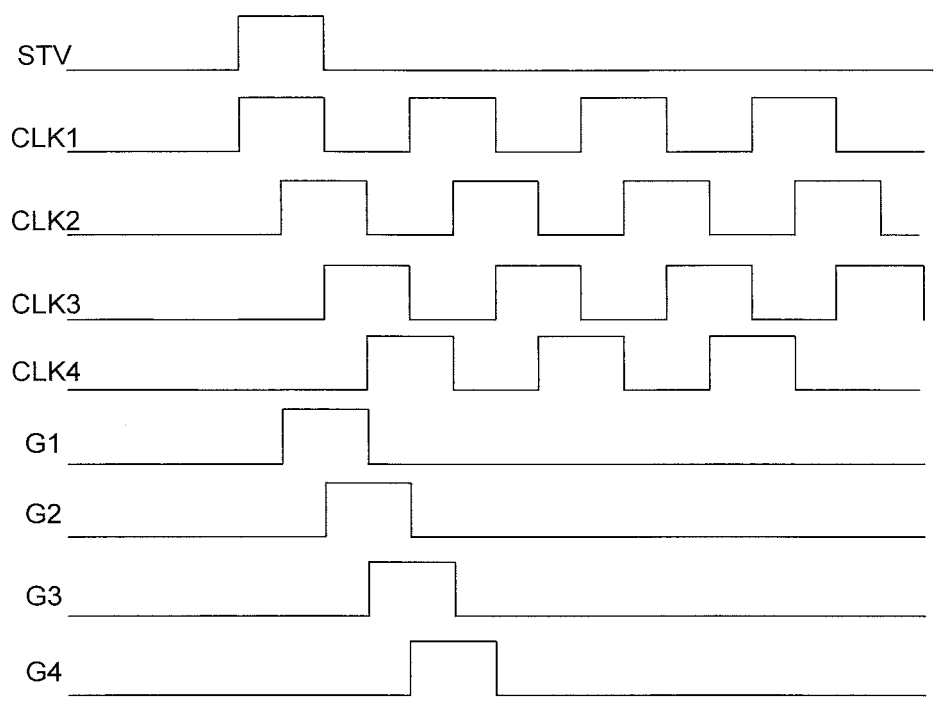
FIG. 6 is a schematic diagram of a driving sequence of the gate driving circuit illustrated in FIG. 5.

FIG. 6 is a schematic diagram of a driving sequence of the gate driving circuit illustrated in FIG. 5. In FIG. 6, STV is a waveform of a start vertical pulse signal input at an input terminal of the shift register unit SR1, G1 represents a waveform of an output signal of an output terminal of the shift register unit SR1, G2 represents a waveform of an output signal of an output terminal of the shift register unit SR2, G3 represents a waveform of an output signal of an output terminal of the shift register unit SR3, and G4 represents a waveform of an output signal of an output terminal of the shift register unit SR4. All transistors are N type transistors. A rising edge of the StarT Vertical pulse signal STV of the input terminal of the shift register unit SR1 and a rising edge of a clock signal of CLK1 are input at the same time.

In FIG. 6, CLK1-CLK4 represent waveform charts of the first to fourth clock signals respectively. The first to fourth clock signals have a duty cycle of 50% and have a period T. For any two adjacent clock signals of the first to fourth clock signals, a posterior clock signal has a phase of ¼ of the period T lagging with respect to a preceding clock signal.

The gate driving circuit according to the embodiments of the present disclosure includes an input module, an output module and an input/output control module. Compared with the structure in the prior art, there is no need to design a reset module, and therefore there is also no need to design reset circuits among the shift register units. This can simplify the design of connection lines among the shift register units, reduce areas of the shift register units, and thereby be beneficial to achieve a narrow frame of the product.

The embodiments of the present disclosure further provide a display apparatus, including the above gate driving circuit. The display apparatus may be a display panel, an electronic paper, a mobile phone, a television, a digital photo frame, an LCD, an OLED, a display etc.

The above description is merely specific embodiments of the present disclosure, and the protection scope of the present disclosure is not limited thereto. Changes or substitutions, which can be obviously envisaged by those skilled persons in the art within the technical scope disclosed by the present disclosure, should be included in the scope of the present disclosure. The protection scope of the present disclosure should be defined by the protection scope of the claims.

What is claimed is:

1. A shift register unit, comprising:
an input module connected to an input terminal, a first control signal terminal and a first node, to output an input signal of the input terminal to the first node under the control of a first control signal of the first control signal terminal;
an output module connected to the first node, a second node, a second control signal terminal, an output terminal and a second level terminal, to output a second control signal of the second control signal terminal or a second level signal of the second level terminal to the output terminal under the control of the first node and the second node; and
an output control module connected to the first node, the second node, the output terminal, a first level terminal and the second level terminal, to control levels of the first node and the second node under the control of a signal of the output terminal, the first level signal of the first level terminal and the second level signal of the second level terminal,
wherein the second control signal causes the output terminal to output the input signal at a predetermined time and output a reset level at a different time.

2. The shift register unit according to claim 1, wherein the input module comprises:
a first transistor having a first electrode connected to the input terminal, a second electrode connected to the first node, and a gate electrode connected to the first control signal terminal,
wherein the first electrode is one of a source electrode and a drain electrode, and the second electrode is the other of the source electrode and the drain electrode.

3. The sifting register unit according to claim 1, wherein the input module comprises two transistors in series, the two transistors each have gate electrodes connected to the first control signal terminal, a first transistor of the two transistors has a first electrode connected to the input terminal, a second transistor of the two transistors has a first electrode connected to a second electrode of the first transistor, and the second transistor has a second electrode connected to the first node,
wherein the first electrode is one of a source electrode and a drain electrode, and the second electrode is the other of the source electrode and the drain electrode.

4. The shift register unit according to claim 1, wherein the output module comprises a pull-up module and a pull-down module, and wherein
the pull-up module is connected to the second control signal terminal, the first node and the output terminal, to output the second control signal of the second control signal terminal to the output terminal under the control of the first node; and
the pull-down module is connected to the output terminal, the second node and the second level terminal, to output the second level signal of the second level terminal to the output terminal under the control of the second node.

5. The shift register unit according to claim 4, wherein the pull-up module comprises:
a second transistor having a first electrode connected to the second control signal terminal, a gate electrode connected to the first node, and a second electrode connected to the output terminal,
wherein the first electrode is one of a source electrode and a drain electrode, and the second electrode is the other of the source electrode and the drain electrode.

6. The shift register unit according to claim 4, wherein the pull-down module comprises:
a sixth transistor having a first electrode connected to the output terminal, a gate electrode connected to the second node, and a second electrode connected to the second level terminal,
wherein the first electrode is one of a source electrode and a drain electrode, and the second electrode is the other of the source electrode and the drain electrode.

7. The shift register unit according to claim 1, wherein the output control module comprises:
a capacitor having one terminal connected to the first node and the other terminal connected to the output terminal;
a third transistor having a first electrode connected to the first node, a second electrode connected to the second level terminal, and a gate electrode connected to the second node;
a fourth transistor having a first electrode and a gate electrode connected to the first level terminal, and a second electrode connected to the second node; and
a fifth transistor having a first electrode connected to the second node, a gate electrode connected to the first node, and a second electrode connected to the second level terminal,
wherein the first electrode is one of a source electrode and a drain electrode, and the second electrode is the other of the source electrode and the drain electrode.

8. The shift register unit according to claim 1, wherein the output control module comprises:
a capacitor having one terminal connected to the first node and the other terminal connected to the output node;
a third transistor and a seventh transistor, wherein the third transistor has a first electrode connected to the first node and a second electrode connected to a first electrode of the seventh transistor, the third transistor and the seventh transistor each have gate electrodes connected to the second node, and the seventh transistor has a second electrode connected to the second level terminal;
a fourth transistor having a first electrode and a gate electrode connected to the first level terminal, and a second electrode connected to the second node; and a fifth transistor having a first electrode connected to the second node, a gate electrode connected to the first node, and a second electrode connected to the second level terminal, wherein the first electrode is one of a source electrode and a drain electrode, and the second electrode is the other of the source electrode and the drain electrode.

9. The shift register unit according to claim 1, wherein the first level signal is a high level signal and the second level signal is a low level signal.

10. The shift register unit according to claim 1, wherein both the first control signal and the second control signal are clock control signals, and there is a predetermined phase difference between the second control signal and the first control signal.

11. A gate driving circuit, comprising a plurality of cascaded shift register units according to claim 1, wherein
an input terminal of a first stage of shift register unit receives a start vertical pulse signal to start outputting output signals at various stages in sequence,
wherein for any shift register unit excluding the first stage of shift register unit and a last stage of shift register unit, an output terminal of the shift register unit is connected to a signal input terminal of a next stage of shift register unit;
the $n^{th}$ stage of shift register unit has a first control signal terminal connected to a first clock signal input terminal and a second control signal terminal connected to a second clock signal input terminal;
the $(n+1)^{th}$ stage of shift register unit has a first control signal terminal connected to the second clock signal input terminal and a second control signal terminal connected to a third clock signal input terminal;
the $(n+2)^{th}$ stage of shift register unit has a first control signal terminal connected to the third clock signal input terminal and a second control signal terminal connected to a fourth clock signal input terminal;
the $(n+3)^{th}$ stage of shift register unit has a first control signal terminal connected to the fourth clock signal input terminal and a second control signal terminal connected to the first clock signal input terminal,
wherein n=4m+1 and m is an integer larger than or equal to 0, and
first level terminals of all shift register units are connected together, and second level terminals of all shift register units are connected together.

12. The gate driving circuit according to claim 11, wherein the input module of each shift register unit comprises:
a first transistor having a first electrode connected to the input terminal, a second electrode connected to the first node, and a gate electrode connected to the first control signal terminal,
wherein the first electrode is one of a source electrode and a drain electrode, and the second electrode is the other of the source electrode and the drain electrode.

13. The gate driving circuit according to claim 11, wherein the input module of each shift register unit comprises two transistors in series, the two transistors each have gate electrodes connected to the first control signal terminal, a first transistor of the two transistors has a first electrode connected to the input terminal, a second transistor of the two transistors has a first electrode connected to a second electrode of the first transistor, and the second transistor has a second electrode connected to the first node,
wherein the first electrode is one of a source electrode and a drain electrode, and the second electrode is the other of the source electrode and the drain electrode.

14. The gate driving circuit according to claim 11, wherein the output module of each shift register unit comprises a pull-up module and a pull-down module, and wherein
the pull-up module is connected to the second control signal terminal, the first node and the output terminal, to output the second control signal of the second control signal terminal to the output terminal under the control of the first node; and
the pull-down module is connected to the output terminal, the second node and the second level terminal, to output the second level signal of the second level terminal to the output terminal under the control of the second node.

15. The gate driving circuit according to claim 11, wherein the output control module of each shift register unit comprises:
a capacitor having one terminal connected to the first node and the other terminal connected to the output terminal;
a third transistor having a first electrode connected to the first node, a second electrode connected to the second level terminal, and a gate electrode connected to the second node;
a fourth transistor having a first electrode and a gate electrode connected to the first level terminal, and a second electrode connected to the second node;
a fifth transistor having a first electrode connected to the second node, a gate electrode connected to the first node, and a second electrode connected to the second level terminal,
wherein the first electrode is one of a source electrode and a drain electrode, and the second electrode is the other of the source electrode and the drain electrode.

16. The gate driving circuit according to claim 11, wherein the output control module of each shift register unit comprises:
a capacitor having one terminal connected to the first node and the other terminal connected to the output node;
a third transistor and a seventh transistor, wherein the third transistor has a first electrode connected to the first node and a second electrode connected to a first electrode of the seventh transistor, the third transistor and the seventh transistor each have gate electrodes connected to the second node, and the seventh transistor has a second electrode connected to the second level terminal;
a fourth transistor having a first electrode and a gate electrode connected to the first level terminal, and a second electrode connected to the second node; and
a fifth transistor having a first electrode connected to the second node, a gate electrode connected to the first node, and a second electrode connected to the second level terminal,
wherein the first electrode is one of a source electrode and a drain electrode, and the second electrode is the other of the source electrode and the drain electrode.

17. A method for driving a gate driving circuit according to claim 11, comprising:
providing the first level signal at the first level terminal and providing the second level signal at the second level terminal;
providing a first clock signal, a second clock signal, a third clock signal and a fourth clock signal at the first clock signal input terminal, the second clock signal input terminal, the third clock signal input terminal, and the fourth clock signal input terminal respectively, to cause output terminals of various stages of shift register unit to output in sequence,
wherein there is a first predetermined phase difference between the second clock signal and the first clock signal, a second predetermined phase difference between the third clock signal and the second clock signal, a third predetermined phase difference between the fourth clock signal and the third clock signal, and a fourth predetermined phase difference between the first clock signal and the fourth clock signal.

18. The method according to claim 17, wherein the first clock signal is an inversion signal of the third clock signal, and the second clock signal is an inversion signal of the fourth clock signal.

19. The method according to claim 17, wherein the first level signal is a high level signal and the second level signal is a low level signal.

20. A display apparatus, comprising a gate driving circuit according to claim 11.

* * * * *